(12) United States Patent
Inao et al.

(10) Patent No.: US 7,144,682 B2
(45) Date of Patent: Dec. 5, 2006

(54) NEAR-FIELD EXPOSURE METHOD

(75) Inventors: Yasuhisa Inao, Atsugi (JP); Ryo Kuroda, Kawasaki (JP); Natsuhiko Mizutani, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 232 days.

(21) Appl. No.: 10/654,913

(22) Filed: Sep. 5, 2003

(65) Prior Publication Data

US 2004/0121245 A1    Jun. 24, 2004

(30) Foreign Application Priority Data

Sep. 6, 2002    (JP)    ............... 2002-261293

(51) Int. Cl.
*G03F 7/20*    (2006.01)
(52) U.S. Cl. ............... 430/311; 430/319; 430/321
(58) Field of Classification Search ............... 430/311
See application file for complete search history.

(56) References Cited

U.S. PATENT DOCUMENTS

| | | | |
|---|---|---|---|
| 6,171,730 B1* | 1/2001 | Kuroda et al. ............... | 430/5 |
| 6,187,482 B1* | 2/2001 | Kuroda et al. ............... | 430/5 |
| 6,236,033 B1* | 5/2001 | Ebbesen et al. ............ | 250/216 |
| 6,243,348 B1* | 6/2001 | Goodberlet ............... | 369/101 |
| 6,303,276 B1* | 10/2001 | Savant et al. ............... | 430/321 |
| 6,559,926 B1 | 5/2003 | Yamaguchi et al. .......... | 355/53 |
| 6,573,959 B1* | 6/2003 | Molsen ....................... | 349/113 |
| 2001/0046719 A1 | 11/2001 | Yamaguchi et al. .......... | 438/11 |
| 2002/0015919 A1* | 2/2002 | Kristensen et al. ......... | 430/321 |
| 2002/0071106 A1 | 6/2002 | Yano et al. .................... | 355/53 |
| 2002/0196420 A1* | 12/2002 | Naya ........................... | 355/71 |
| 2003/0128361 A1 | 7/2003 | Kuroda et al. ............. | 356/400 |
| 2005/0026047 A1* | 2/2005 | Yang .............................. | 430/5 |

FOREIGN PATENT DOCUMENTS

JP    2000-112116    4/2000

OTHER PUBLICATIONS

Alkaisi, M. M. et al., "Sub-diffraction-limited patterning using evanescent near-field optical lithography", (1999) Applied Physics Letters, vol. 75, No. 22, pp. 3560-3562.*

Blaikie, R. J., et al. "Nanolithography Using Optical Contact Exposure in Evanescent Near Field," *Microelectronic Engineering*, vol. 56, No. 1-4, May 1999. Elsevier Publishers BV, Amsterdam. pp. 85-88.

(Continued)

*Primary Examiner*—S. Rosasco
*Assistant Examiner*—John Ruggles
(74) *Attorney, Agent, or Firm*—Fitzpatrick, Cella, Harper & Scinto

(57) ABSTRACT

A method for exposing a workpiece on the basis of near-field light escaping from an exposure mask having a light blocking film with a plurality of rectangular openings. The method includes protecting non-polarized near-field exposure light from a light source through the openings of the exposure mask to perform exposure of a pattern on the workpiece. The widths of the rectangular openings are smaller than that at a cross-point between a first curve on a coordinate of widths of the openings versus a near-field light intensity for an incident-light electric-field direction perpendicular to a lengthwise direction of a small-opening pattern and a second curve on the same coordinate for an incident-light electric-field direction parallel to the lengthwise direction of the small-opening pattern.

1 Claim, 4 Drawing Sheets

OTHER PUBLICATIONS

Alkaisi, M. M., et al. "70 nm Features on 140 nm Period Using Evanescent Near Field Optical Lithography," *Microelectronic Engineering*, vol. 53, No. 1-4, Jun. 2000. Elsevier Publishers BV, Amsterdam. pp. 237-240.

Alkaisi, M. M., et al. "Nanolithography in th Evanescent Near Field," *Advanced Materials*, vol. 13, No. 12/13, Jul. 4, 2001. VCH Verlagsgesellschaft, Weinheim, DE. pp. 877-887.

PCT International Search Report dated Jul. 6, 2004, issued in corresponding PCT patent appln. No. PCT/JP03/11357, mailed Jul. 14, 2004.

Alkaisi, M. M., et al., "Sub-diffraction-limited patterning using evanescent near-field optical lithography," Appl. Phys. Lett. vol. 75(22), Nov. 29, 1999. pp. 3560-3562.

Blaikie, R. J., et al., "Nanolithography Using Optical Contact Exposure in the Evanescent Near Field," Microelectron. Eng. 46(1), May 31, 1999. pp. 85-88.

* cited by examiner

NEAR-FIELD EXPOSURE METHOD

FIELD OF THE INVENTION

This invention relates to an exposure method, an exposure mask, and an exposure apparatus for use in the manufacture of semiconductor devices or optical devices.

Reduction in size and thickness of electronic devices has been particularly desired in recent years, and this has made stricter the requirements for smallness of a semiconductor chip to be incorporated into such electronic devices. For example, as regards the design rule for a mask or reticle pattern, it is being reduced more and more, in order to accomplish mass-production of a 130 nm line-and-space (L & S) pattern. The line-and-space pattern is an image as projected upon a wafer, being in a state in which the line and the space have an even width, and thus, it is a scale that represents the resolution of exposure.

Projection exposure apparatuses mainly used in recent years generally comprise an illumination optical system for illuminating a mask by use of a light flux emitted from a light source, and a projection optical system disposed between a mask and an object to be exposed. In the illumination optical system, in order to obtain a uniform illumination region, the light flux from the light source is introduced into a light integrator such as a fly's eye lens having a plurality of rod lenses, for example, and a light exit surface of the light integrator operates as a secondary light source surface to Koehler-illuminate the mask surface through a condenser lens.

The resolution R of a projection exposure apparatus is given by the following equation, on the basis of the wavelength $\lambda$ of a light source and the numerical aperture (NA) of the exposure apparatus.

$$R = k_1 \times [\lambda/NA] \quad (1)$$

It is seen from this that, by shortening the wavelength, or by enlarging the NA, the resolution can be improved.

On the other hand, the focus range in which a certain imaging performance can be maintained is called a depth of focus, and the depth of focus (DOF) is given by the following equation.

$$DOF = k_2 \times [\lambda/NA^2] \quad (2)$$

It is seen from this that, by shortening the wavelength, or by enlarging the NA, the depth of focus becomes smaller. If the depth of focus is small, focus adjustment becomes difficult to accomplish, and the flatness of a substrate or focus precision should be improved. Basically, therefore, the depth of focus should desirably be larger.

It would be understood from equations (1) and (2) that shortening the wavelength, rather than increasing the NA, is effective.

For this reason, in recent years, light sources are changing from conventional ultra-high pressure Hg lamps to short-wavelength KrF excimer lasers (the wavelength is about 248 nm) or ArF excimer lasers (the wavelength is about 193 nm).

However, the proportional constants $k_1$ and $k_2$ usually take a value of about 0.5 to 0.7. Even if a certain resolution enhancing method such as a phase shift method is used, constants $k_1$ and $k_2$ would not go below about 0.4. Therefore, it is difficult to improve the resolution by decreasing the proportional constants. Further, in projection exposure apparatuses, it is said that, generally, the resolution has its limit approximately at the wavelength of a light source used. Even when an excimer laser is used, it is difficult for a projection exposure apparatus to form a pattern not greater than 0.10 µm. Additionally, if there is any light source having a shorter wavelength present, optical materials to be used for the projection optical system (i.e., the lens glass material) could not transmit exposure light of such a short wavelength, and thus (because of the resultant failure of projection upon an object to be exposed), the exposure would end in failure. More specifically, almost all the glass materials have a transmissivity nearly equal to zero in the deep ultraviolet region. Synthetic quartz, which can be produced by use of a special production method, can transmit exposure light having a wavelength of about 248 nm. However, the transmissivity of the synthetic quartz decreases steeply for wavelengths not greater than 193 nm. For these reasons, it is very difficult to develop a practical glass material having a sufficiently large transmissivity to exposure light having a wavelength not greater than 150 nm, corresponding to a fine pattern of 0.10 µm, or narrower. Furthermore, in addition to the transmissivity, a glass material to be used in the deep ultraviolet region must satisfy certain conditions from several standpoints, such as durability, refractivity, uniformness, optical distortion, machinability, and so on. These factors also make the development of a practical glass material difficult.

To such a problem, exposure apparatuses, which are based on the principle of a near-field optical microscope (Scanning Near-Field Optical Microscope: SNOM) have been recently proposed as a measure for enabling microprocessing with an order not greater than 0.1 µm. U.S. Pat. No. 6,171,730 proposes an apparatus in which a mask being elastically deformable in a direction of a normal to the mask surface is closely contacted to a resist and in which, by use of near-field light seeping or escaping from a small-opening pattern formed on the mask surface and having a size not greater than 100 nm, an object to be exposed is locally exposed, thereby exceeding the limit of the wavelength of light.

When the exposure is performed on the basis of near-field light, there is a phenomenon that the intensity distribution of near-field light produced is changeable with the direction of polarization of light projected through a small-opening pattern. For example, when the small-opening pattern has a width of about a half of the wavelength of light to be projected, and if a comparison is made to a case wherein the electric-field direction of light incident on the small-opening pattern of the mask is perpendicular to the lengthwise direction of the small-opening pattern (i.e., the electric-field direction of the incident light is in the same direction as the widthwise direction of the small-opening pattern) and a case wherein they are parallel to each other (i.e., the electric-field direction of the incident light is in the same direction as the lengthwise direction of the small-opening pattern), the intensity itself of the near-field light escaping from the small-opening pattern is the same, in both cases. However, regarding the intensity distribution in the latter case, wherein the near-field light escaping from the small-opening pattern is in a direction perpendicular to the lengthwise direction of a small-opening pattern (i.e., it is in the widthwise direction of the small-opening pattern), the near-field light in the former case has a smaller expansion of the intensity distribution. Based on this, a finer pattern can be formed by controlling the direction of polarization of the light impinging on the small-opening pattern.

For example, Japanese Laid-Open Patent Application No. 2000-112116 proposes that a mask to be used for the exposure, which is based on the near-field light, is provided with polarizer elements adapted to transmit only such light as being polarized in a direction parallel to the lengthwise direction of a small-opening pattern, thereby to control the polarization direction of the light.

However, in the near-field light exposure mask with a polarizer, as proposed in Japanese Laid-Open Patent Application No. 2000-112116, in regard to every region where a small-opening pattern is present, it is necessary to provide a polarizer corresponding to the direction of the small-opening pattern. This results in increased cost of mask production.

Furthermore, if the width of the small-opening pattern is made smaller than one-third of the exposure wavelength in an attempt to form a still finer pattern, there is a possibility that the aspect ratio of a pattern to be formed on the resist decreases.

SUMMARY OF THE INVENTION

In accordance with an aspect of the present invention, there is provided an exposure method for exposing a workpiece on the basis of near-field light escaping from an opening of a mask, the improvements residing in that non-polarized exposure light from a light source is projected onto an exposure mask having a light blocking film and a plurality of rectangular openings formed in the light blocking film, the openings having a width in a widthwise direction not greater than one-third of the exposure light and having its lengthwise directions extending in two or more directions along the mask surface, so that near-field light escaping from the openings is produced, thereby to perform exposure of a pattern on the basis of the openings.

In accordance with another aspect of the present invention, there is provided an exposure mask having a light blocking film and an opening formed in the light blocking film, for use in exposure of an object to be exposed, by use of near-field light escaping from the opening, the improvements residing in that the opening comprises a plurality of rectangular openings having a width in a widthwise direction not greater than one-third of exposure light, and having lengthwise directions extending in two or more directions along the mask surface.

In accordance with a further aspect of the present invention, there is provided an exposure apparatus having light projecting means and an exposure mask, for exposing a workpiece on the basis of near-field light escaping from the mask, the improvement residing in that the light projecting means projects non-polarized exposure light to the exposure mask, and that the exposure mask has a light blocking film and an opening formed in the light blocking film, the opening including a plurality of rectangular openings having a width in a widthwise direction not greater than one-third of the exposure light and having lengthwise directions extending in two or more directions along the mask surface.

In accordance with a further aspect of the present invention, there is provided an exposure method for exposing a workpiece on the basis of near-field light escaping from an opening of a mask, the improvements residing in that non-polarized exposure light from a light source is projected onto an exposure mask having a light blocking film and a plurality of rectangular openings formed in the light blocking film, that near-field light escaping from the openings is produced, thereby to perform exposure of a pattern on the basis of the openings, and that the widths of the openings are smaller than that at a cross-point between a first curve on a coordinate of a width of the openings versus a near-field light intensity for an incident-light electric-field direction perpendicular to a lengthwise direction of a small opening pattern and a second curve on the same coordinate for an incident-light electric-field direction parallel to the lengthwise direction of the small-opening pattern.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
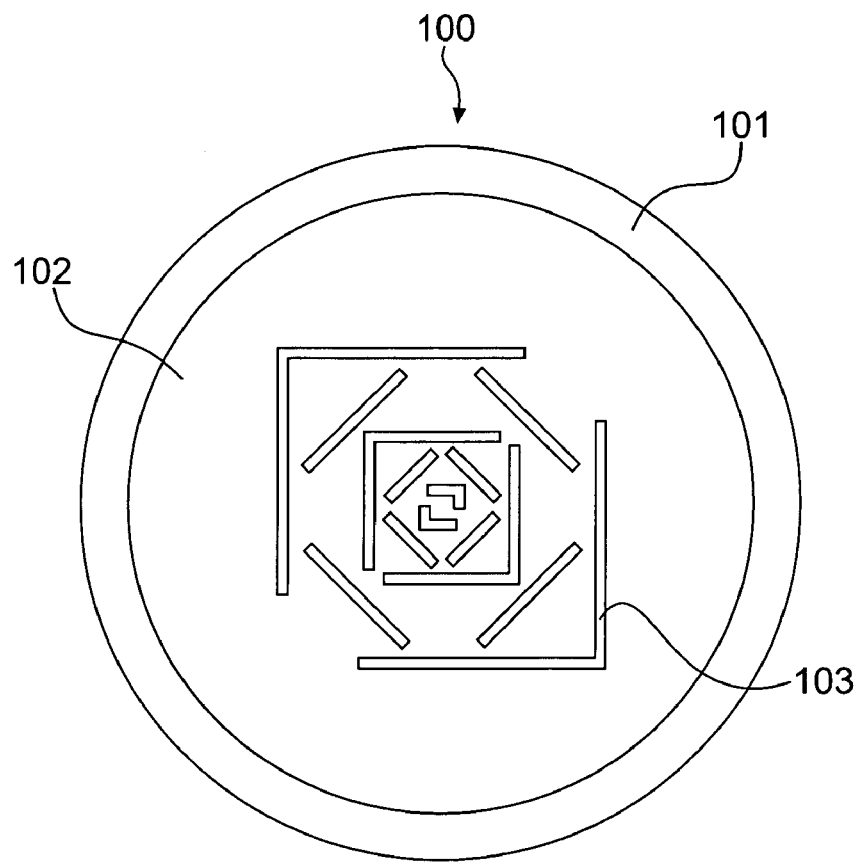
FIG. 1A is a schematic view of an exemplary exposure mask according to the present invention.

Preferred embodiments of the present invention will now be described with reference to the attached drawings.

An exposure method, an exposure mask and an exposure apparatus to be provided in accordance with the present invention are such as described above.

Referring now to the drawings, an exemplary exposure method 1 according to the present invention will be explained first. Here, embodied forms of the present invention will be described in detail with reference to FIGS. 1A, 1B and 2.

Figure 1B:
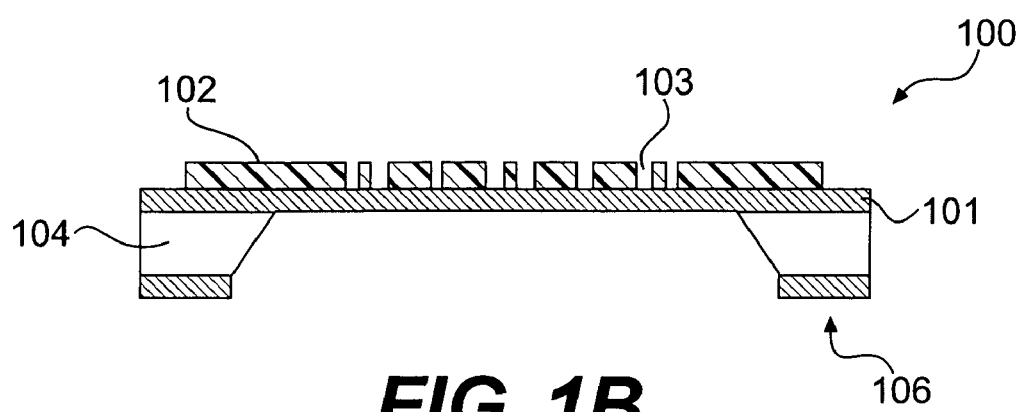
FIG. 1B is a schematic and sectional view of an exemplary exposure mask according to the present invention.
Figure 2:
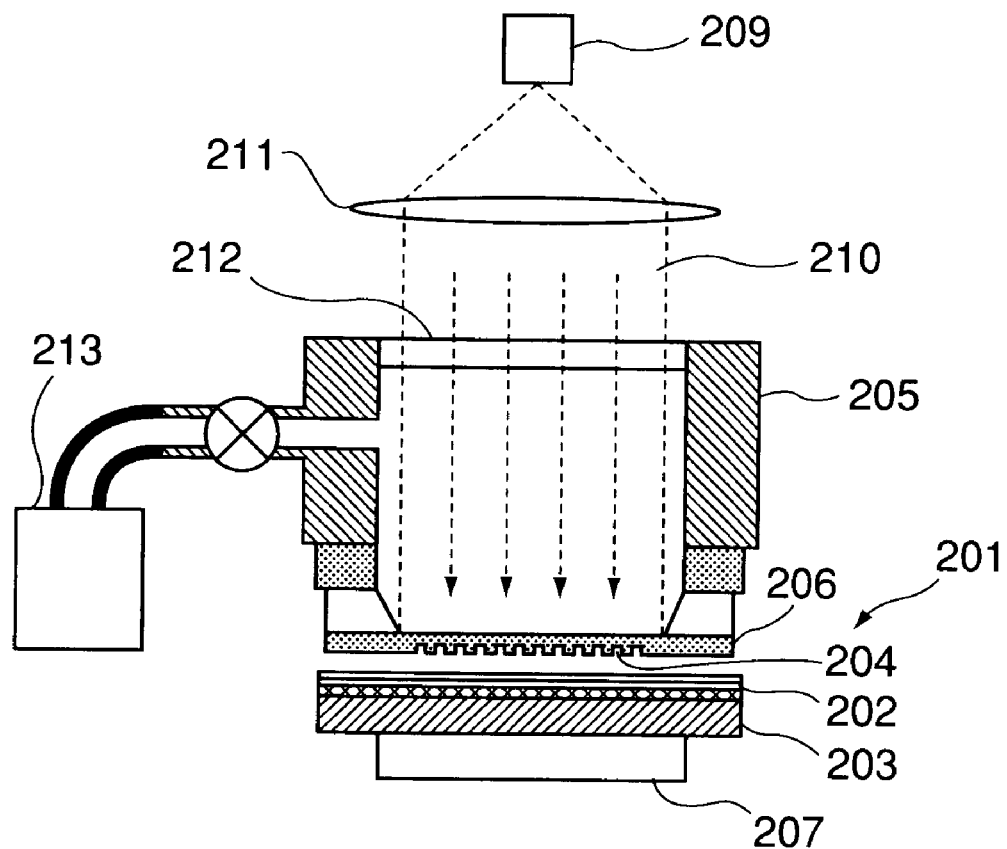
FIG. 2 is a schematic and sectional view of an exemplary exposure apparatus according to the present invention.

FIGS. 1A and 1B show the structure of an exposure mask according to the present invention. FIG. 2 is a view which illustrates an example of the structure of an exposure apparatus, using such an exposure mask.

Referring to FIGS. 1A and 1B, an exposure mask 100 according to the present invention will be explained. FIGS. 1A and 1B illustrate an exposure mask to be used in the exposure apparatus shown in FIG. 2. FIG. 1A illustrates the front surface side, and FIG. 1B is a sectional view. Here, in the present invention, the "front surface" refers to the surface on which a light blocking film is provided, and the "rear surface" refers to the opposite side.

The exposure mask 100 shown in FIGS. 1A and 1B comprises a mask supporting member 104, a mask base material 101, and a light blocking film 102. The light blocking film 102 is formed upon the mask base material 101, and small openings are formed in this light blocking film 102 to define a desired pattern 103. The small-opening pattern 103 formed on the exposure mask 100 includes patterns of rectangles or is defined by connecting rectangles. These rectangles have a width in the widthwise direction, which is not greater than one-third of the light wavelength of the exposure light source, and their lengthwise directions extend in at least two directions along the mask surface. The mask base material 101 is made of an elastic material, and it is present there as a thin film.

Although it will be described later with reference to FIG. 2, this exposure mask is mounted with its rear surface facing to the inside of a pressure adjusting vessel of the near-field exposure apparatus, and pressure adjustment is applied thereto to adjust flexure of the mask.

The near-field exposure apparatus shown in FIG. 2 generally consists of a pressure adjusting system, an exposure mask, a light source, and an object to be exposed. As described above, the exposure mask is mounted with its rear surface facing the pressure adjusting system, and it is disposed to be opposed to the object to be exposed.

As regards the object to be exposed, a resist 202 is provided on the surface of a substrate 203. The resist 202 and the substrate 203 are mounted on a stage 207 and, by moving the stage 207, relative alignment of the substrate 203 relative to the exposure mask 201 with respect to two-dimensional directions along the mask surface, is carried out. Subsequently, the stage 207 is moved in a direction of a normal to the mask surface, and the exposure mask 201 and the substrate 203 are brought into close contact with each other so that the clearance between the front surface of the exposure mask 201 and the resist surface 202 of the substrate 203 becomes not greater than 100 nm, throughout the entire surface.

After this, exposure light 210 transformed from an exposure light source 209 is transformed by a collimator lens 211 into parallel light and, thereafter, the light is directed through a glass window 212 into the pressure adjusting vessel 205. The light illuminates the exposure mask 201 from its rear surface side (top in FIG. 2), and the resist 202 is exposed with near-field light escaping from a small-opening pattern 204 formed in the light blocking film on the mask base material 206, which is at the front surface of the exposure mask 201.

Here, in the present invention, the exposure light 210 emitted from the exposure light source 209 can illuminate the rear surface of the exposure mask 201, with light having an electric-field strength along a plane parallel to the exposure mask 201, which strength is substantially omnidirectionally uniform in that plane. Namely, non-polarized light can be used.

As described hereinbefore, as long as the width of the small-opening pattern is not less than about half of the exposure wavelength, the intensity distribution of the near-field light (in the widthwise direction of the small-opening pattern) produced from the small opening becomes narrower when light polarized in a direction parallel to the lengthwise direction of the small-opening pattern is projected, as compared with a case wherein light polarized with its electric-field direction perpendicular to the lengthwise direction of the small-opening pattern is projected. However, if the width of the small-opening pattern is made smaller than one-third of the exposure wavelength so as to form a fine pattern, and wherein light being polarized in the parallel direction is projected, the aspect ratio of a pattern formed on the resist decreases.

This is because of the following reason. If the width of the small-opening pattern becomes not greater than one-third of the wavelength of light projected, the intensity of near-field light escaping from the small-opening pattern in a case wherein the electric-field direction of the light incident on the small-opening pattern of the mask is parallel to the lengthwise direction of the small-opening pattern becomes almost the same as the intensity of light, which is directly transmitted through the light blocking film portion, other than the small openings. Therefore, in the light intensity distribution adjacent to the small openings, this directly transmitted light is superposed with the near-field light as background light, such that the light intensity contrast between the opening area and the non-opening area, adjacent to the small openings, largely decreases.

Figure 5:
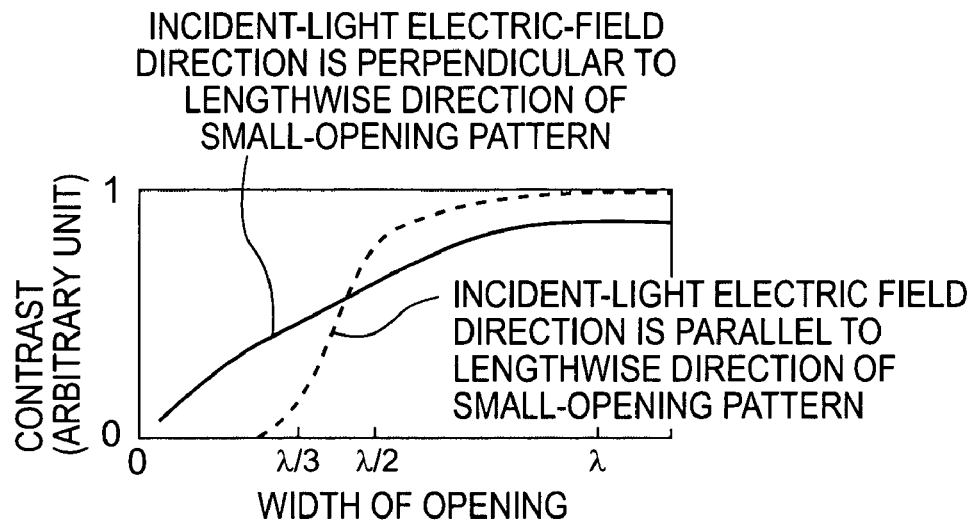
FIG. 5 is a view for illustrating the dependence, upon the electric-field direction, of the relation between the contrast of near-field intensity produced from a small-opening pattern and the opening width.

However, as shown in FIG. 5, the intensity of near-field light escaping from the small-opening pattern in a case wherein the electric-field direction of the light incident on the small-opening pattern of the mask is perpendicular to the lengthwise direction of the small-opening pattern, is larger than the intensity of light, which is directly transmitted through the light blocking film portion, other than the small openings. Therefore, in the light intensity distribution adjacent to the small openings, the influence of superposition of this directly transmitted light with the near-field light as background light is smaller, so that the decrease of light intensity contrast between the opening area and the non-opening area, adjacent to the small openings, can be made smaller.

Therefore, if the width of the small-opening pattern is not greater than one-third of the wavelength of light projected, the aspect ratio of a pattern to be formed on the resist can be made larger in the case wherein the light polarized with its electric-field direction being perpendicular to the lengthwise direction of the small-opening pattern is projected, as compared with the case wherein the light polarized with its electric-field direction being parallel to the lengthwise direction of the small-opening pattern is projected.

Figure 6:
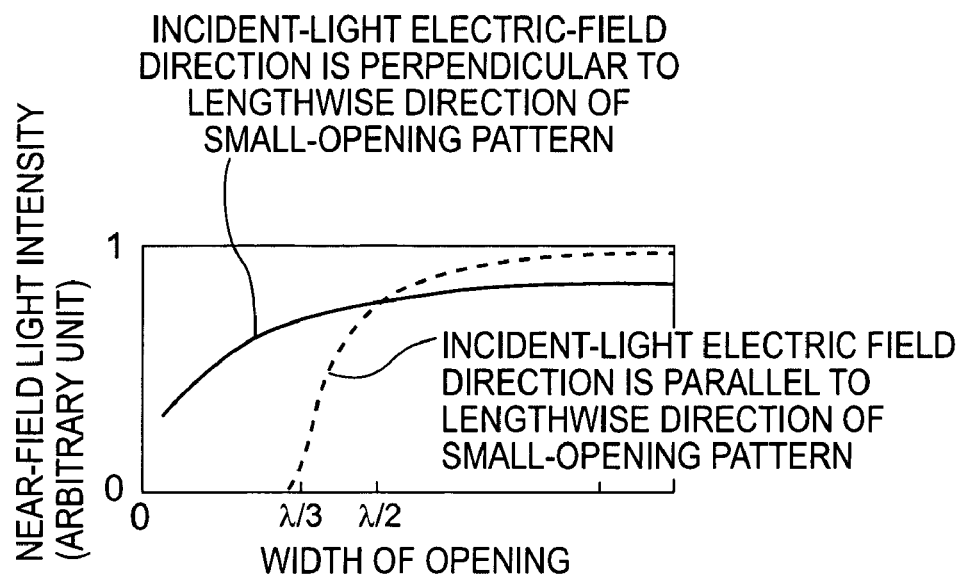
FIG. 6 is a view for illustrating the dependence, upon the electric-field direction, of the relation between the near-field intensity produced from a small-opening pattern and the opening width.

Further, as shown in FIG. 6, if the width of the small-opening pattern is not greater than one-third of the wavelength of light projected, as compared with the intensity of near-field light escaping from the small-opening pattern in a case wherein the electric-field direction of the light incident on the small-opening pattern of the mask is parallel to the lengthwise direction of the small-opening pattern (i.e., the electric-field direction of the incident light is in the same direction as the lengthwise direction of the small-opening pattern), the intensity of near-field light escaping from the small-opening pattern in a case wherein they are perpendicular to each other (i.e., the electric-field direction of the incident light is in the same direction as the widthwise direction of the small-opening pattern) is larger. Here, the calculation results, in a case wherein the light blocking film is Cr (complex dielectric constant: −13.1+14.3i) and the thickness of the light blocking film is 100 nm, are shown.

Thus, by projecting light having an electric-field strength along a plane parallel to the rear surface of the near-field mask, which strength is uniform in the omni-direction in that plane, to the near-field mask from the rear surface of the mask, it is assured that, regardless of the direction in which the lengthwise direction of the small-opening pattern of the near-field mask is placed, the intensity of near-field light escaping from the small-opening pattern on the basis of a component of the light incident on the small-opening pattern and having an electric-field direction perpendicular to the lengthwise direction of the small-opening pattern, is made larger than the intensity of near-field light based on a parallel component.

For this reason, even with a near-field mask having a small-opening pattern, which includes lengthwise directions extending in two or more directions along the near-field mask surface, it is assured that, when the projected light passes through the small-opening pattern, only the polarized light component whose electric-field direction is substantially in the same direction as the widthwise direction of the small-opening pattern (i.e., in the direction perpendicular to the lengthwise direction) escapes from the small-opening pattern as near-field light, such that, in regard to a small-opening pattern having plural directionalities, uniform exposure with a small contrast decrease can be accomplished.

Figure 3:
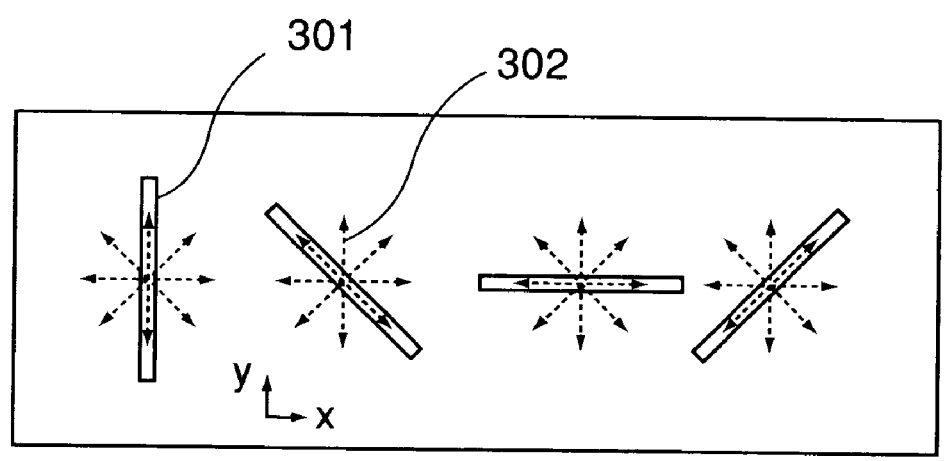
FIG. 3 is a view for illustrating the polarization direction in the present invention.

The present invention uses light, as the exposure light 210, having an electric-field strength along a plane parallel to the near-field mask surface, which strength is omnidirectionally uniform in that plane. Thus, all the polarized light components are included in the exposure light and, therefore, the angular dependence with respect to the lengthwise direction of the small openings is eliminated. Namely, even if the lengthwise direction of the small openings is oriented in any direction, such as the x direction, the y direction, and a direction intermediate between the x and y directions, as shown in FIG. 3, since the exposure light has an omnidirectionally uniform electric-field strength along a plane parallel to the near-field mask surface in that plane, a uniform electric-field component can be applied to the small openings in every direction. As a result, provided that the size of the small openings is not greater than 100 nm, the mask itself does not transmit light having a polarization direction parallel to the lengthwise direction of the small opening, but it operates to selectively transmit light only having a polarization direction perpendicular thereto, to thereby produce a near-field. Thus, regardless of the lengthwise direction of the small opening, a pattern can be produced uniformly.

As regards an exposure light source that can emit light having an electric-field strength along a plane parallel to the mask surface, which strength is omnidirectionally uniform in that plane, a non-polarization light source, such as an Hg lamp, is an example. Further, as a light source having an electric-field strength along a plane parallel to the near-field mask surface, which strength is omnidirectionally uniform in that plane, light normally having a polarization, such as a laser, may be used, if it is sufficiently depolarized by passing it through a depolarization plate or a diffusion plate, for example. Namely, it is sufficient that the exposure light 210, before it is projected upon the exposure mask, is in the state in which the electric-field strength along a plane parallel to the near-field mask surface is omnidirectionally uniform in that plane (i.e., depolarized).

Next, referring to FIG. 2, the manner of closely contacting the exposure mask and the resist/substrate will be explained in detail.

If the front surface of the exposure mask 201 and the resist surface 202 of the substrate 203 are both completely flat, they can be closely contacted to each other, throughout their entire surfaces. Practically, however, the mask surface or the resist/substrate surface contains surface irregularities or waviness. Therefore, only by simply approximating them and contacting them to each other, the resultant stage would be a distribution of closely-contacted portions and non-closely-contacted portions.

In consideration of this, pressure is applied in a direction from the rear surface of the exposure mask 201 toward the front surface thereof, to cause flexure of the exposure mask 201 based on elastic deformation thereof, to thereby press the mask against the resist 202 or substrate 203. As a result of this, the thin film portion can be closely contacted, throughout the entire surface thereof.

As an example of such a pressure application method, as shown in FIG. 2, the exposure mask 201 is mounted with its front face facing toward the outside of the pressure adjusting vessel 205 while the rear face faces to the inside of the pressure adjusting vessel 205. Then, by using pressure adjusting means 213, such as a pump, for example, a high pressure gas is introduced into the pressure adjusting vessel 205, to produce a pressure, higher than the outside atmospheric pressure, inside the pressure adjusting vessel 205.

As an alternative example, the inside of the pressure adjusting vessel 205 may be filled with a liquid, which is transparent with respect to the exposure light 210 and, by using a cylinder, the pressure of the liquid inside the pressure adjusting vessel 205 may be adjusted.

Now, a high pressure gas is introduced into the pressure adjusting vessel 205 by the pressure adjusting means 213 to increase the pressure inside the pressure adjusting vessel 205, by which the front surface of the exposure mask 201 and the resist surface 202 on the substrate 203 are closely contacted to each other, throughout the entire surface thereof.

When pressure is applied in the manner such as described above, in accordance with Pascal's principle, the repulsive force acting between the front surface of the near-field mask 201 and the resist surface 202 becomes uniform. This provides an advantageous effect that no large force is applied locally to the exposure mask 201 or the resist surface 202 on the substrate 203, and this thereby prevents local breakage of the exposure mask 201, the substrate 203 and the resist 202.

Here, by controlling the pressure inside the pressure adjusting vessel 205, the pressing force acting between the exposure mask 201 and the resist 202 or substrate 203, that is, an adhesive force between them, can be controlled. For example, when the surface irregularity or waviness of the mask surface or the resist or substrate surface is large, the pressure inside the pressure adjusting vessel may be set at a relatively higher level to increase the adhesive force, thereby removing non-uniformness of clearance between the mask surface and the resist or substrate surface due to such surface irregularities or waviness.

In this example, for close contact between the exposure mask 201 and the resist 202 or the substrate 203, the rear surface of the exposure mask is disposed inside the pressure adjusting vessel 205, and pressure is applied from the rear surface side to the front surface side of the exposure mask 201 due to the pressure difference between the inside pressure of the pressure adjusting vessel and the outside atmospheric pressure. However, as an inverse structure, the front surface of the near-field mask and the resist or substrate may be disposed inside a reduced pressure vessel so that, due to a pressure difference with the outside atmospheric pressure, which is higher than the inside pressure of the reduced pressure vessel, pressure is applied in a direction from the rear surface side to the front surface side of the near-field mask. Anyway, a pressure difference may be produced so as to provide a higher pressure at the rear surface side, as compared with the front surface side of the near-field mask.

After completion of the exposure based on near-field light, separation of the exposure mask and the resist or substrate is carried out as follows.

By using the pressure adjusting means 213, the pressure inside the pressure adjusting vessel 205 is made smaller than the outside atmospheric pressure, to separate the metal thin film of the exposure mask 201 from the resist surface 202 of the substrate 203.

When the pressure is reduced in the manner described above to separate the exposure mask 201 from the resist 202 or substrate 203, in accordance with Pascal's principle, the attracting force acting between the front surface of the exposure mask 201 and the resist surface 202 of the substrate 203 becomes uniform. This provides an advantageous effect that no large force is applied locally to the exposure mask 201 or the resist surface 202 on the substrate 203, and this thereby prevents local breakage of the exposure mask 201, the substrate 203 and the resist 202.

Here, by controlling the pressure inside the pressure adjusting vessel 205, the attracting force acting between the exposure mask 201 and the resist 202 or substrate 203, that is, the tensile force between them, can be controlled. For example, when the attracting force between the mask surface and the resist or substrate surface is large, the pressure inside the pressure adjusting vessel may be set at a relatively lower level to increase the tensile force, thereby facilitating the separation.

As described hereinbefore, in the pressure application system structure for the close contact, when, as an inverse structure to what was shown in FIG. 2, the front surface of the exposure mask and the resist or substrate are disposed inside a reduced pressure vessel so that, due to a pressure difference with the outside atmospheric pressure, which is higher than the inside pressure of the reduced pressure vessel, a pressure is applied in a direction from the rear surface side to the front surface side of the exposure mask, for the separation, the inside pressure of the vessel may be made higher than the outside atmospheric pressure.

Anyway, for the separation, a pressure difference may be produced so as to provide a lower pressure at the rear surface side, as compared with the front surface side of the near-field mask.

As described, by closely contacting the exposure mask with the resist or substrate and by using non-polarization light as the exposure light, the near-field intensity escaping from the small opening becomes uniform, such that, without the provision of polarizer elements in the exposure mask, non-uniformness of exposure of the resist can be reduced.

Next, a specific example will be described.

This example concerns an exposure apparatus which uses a mask according to the present invention. A description will be made in conjunction with FIGS. 1A, 1B, and 4.

In the exposure mask 100, a Si substrate was chosen for a mask supporting member 104. Upon this Si substrate, a SiN film, as a mask base material 101, was formed with a thickness of 500 nm, in accordance with an LPCVD (a Low Pressure Chemical Vapor Deposition) method. Further, upon the top of the SiN film, which provides the mask surface, a Cr film as a light blocking film layer 102 is formed with a thickness of 50 nm, in accordance with a sputtering method. Small openings (opening diameter not greater than 100 nm) of a size not greater than the wavelength to be used with the Cr material of the light blocking film layer 104, are formed on an electron beam resist into a desired pattern, by means of an EB lithographic method. While using this resist as a mask, in accordance with a dry etching method, the Cr material of the light blocking film layer 102 is etched, to provide a pattern of the mask. As shown in FIG. 1A, the pattern of this mask may include small openings having lengthwise directions extending in many directions. Namely, it may include any small-opening pattern. Subsequently, at the surface on the opposite side of the light blocking film layer 102, patterning with a size of 26 mm×26 mm is carried out in accordance with a photolithographic method, to that portion of the exposure mask which should be made into a thin film portion. Then, a SiN material in that portion is removed by an RIE (a Reactive Ion Etching) method using $CF_4$ gas. The remaining SiN is used as an etching mask 106, and the substrate described above is dipped in an aqueous solution of 30 wt % potassium hydroxide, being warmed at 110° C., by which Si is etched so that Si material only at that portion to be made into a thin film can be removed. With the processes described above, an exposure mask 100 supported by a Si wafer can be produced.

In this example, SiN is used as a base material of the mask, while Cr is used as a light blocking film. However, the concept of the present invention is not limited to the use of a particular material. As regards the base material of the mask, preferably, it should be a material being transmissive to light of the wavelength to be used for the exposure and, also, it should have sufficient mechanical strength when formed into a film. As regards the light blocking film, on the other hand, preferably, it should be a material having no influence upon an object to be exposed and also be a material which does not transmit light of the wavelength to be used for the exposure. Additionally, it may preferably have a thickness by which light can be attenuated sufficiently.

Figure 4:
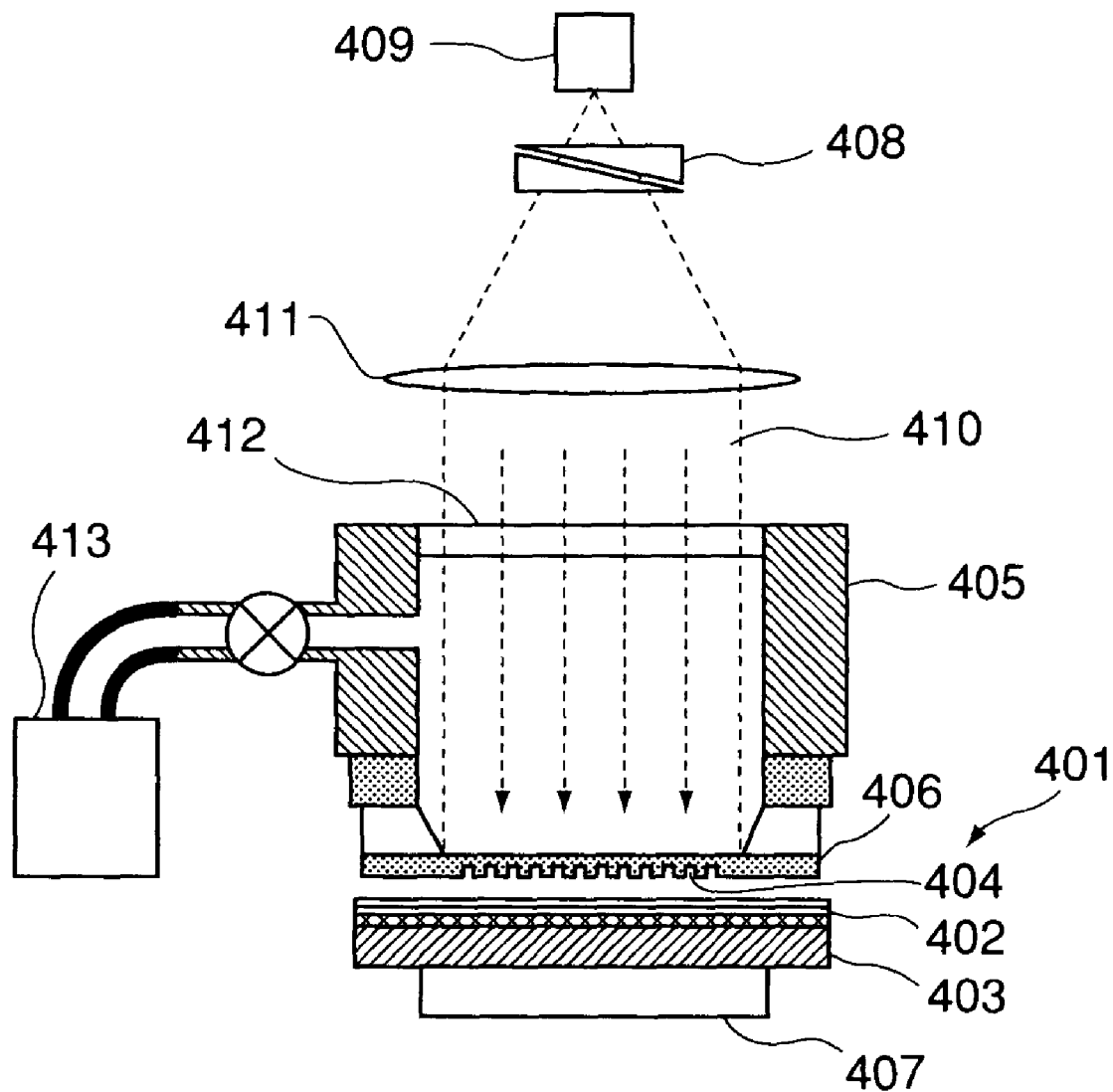
FIG. 4 is a schematic and sectional view of an exposure apparatus according to an embodiment of the present invention.

Referring now to FIG. 4, an exposure process carried out with this example will be explained in detail.

A mask, having been produced in the manner described above, is mounted into an exposure apparatus shown in FIG. 4, for use thereof.

After this, in order to approximate a uniform clearance between resist 402 (object to be exposed) and a thin film mask of an exposure mask 401, throughout entire surface of the resist 402, an alignment operation is carried out between the exposure mask 401 and a substrate 403 being coated with the resist 402. Then, compressed air is introduced into a pressure adjusting vessel 405 at a pressure of 40 kPa, whereby a pressure difference is produced between the front surface and the rear surface of the exposure mask 401. All of the thin film masks are flexed, and a small uniform clearance is approximated with the resist 402, at a clearance not greater than 100 nm.

After this, light emitted from an exposure light source 409, which comprises a Hg lamp of g-line (wavelength 436 nm), i-line (wavelength 365 nm), or a second harmonic generation (SHG) laser having a wavelength 860 nm, may be passed through a depolarization plate 408 to sufficiently depolarize it. Thereafter, it may be passed through a collimator lens 411 to provide parallel light.

As described, by irradiating the whole exposure mask surface with exposure light having an electric-field strength along a plane parallel to the near-field mask surface, which strength is made omnidirectionally uniform in that plane, it is assured that a near-field is produced from small openings of the exposure mask at a uniform intensity, such that, in the exposure based on the near-field, non-uniformness of exposure can be reduced.

For the separation, to the contrary to approximating the exposure mask to the resist 402, the inside pressure of the pressure adjusting vessel 405 is reduced by using a pump to a pressure lower than the atmospheric pressure by about 40 kPa, and the exposure mask is separated from the resist 402.

In this example, the light source used as an exposure light source 409 is provided by depolarizing light from an Hg Lamp or SHG laser. However, the invention is not limited to this. Any light source, which emits light having a wavelength with which a resist 402 that is used can be exposed, may be used. For example, when a photoresist, which can meet g-line (wavelength 436 nm) or i-line (wavelength 365 nm) is used as a resist 402, a blue LED or a HeCd laser (light wavelength 325 nm or 442 nm), a GaN series blue semiconductor laser (light wavelength 410 nm or less), or a third harmonic generation (THG) laser of another infrared laser, may be used.

When normally polarized light, such as a laser, is used, before the light is projected on an exposure mask, it may be passed through a depolarization plate or a diffusion plate to cause sufficient depolarization of it.

According to another aspect of the present invention, in FIG. 6, the widths of the openings are so determined that they are smaller than that at a cross-point between a first curve on a coordinate of the widths of the openings versus a near-field light intensity for an incident-light electric-field direction perpendicular to a lengthwise direction of a small-opening pattern and a second curve on the same coordinate for an incident-light electric-field direction parallel to the lengthwise direction of the small-opening pattern.

With this feature, uniform exposure to the pattern is accomplished.

As described hereinbefore, in accordance with the present invention, an opening pattern can be exposed uniformly. Particularly, when light having an electrical-field strength along a plane parallel to the mask surface is projected to small openings of the mask, the near-field intensity escaping from the small openings in the near-field mask, having an opening pattern including lengthwise directions extending in two or more directions, can be made uniform. As a result, the pattern can be exposed uniformly. This removes the necessity of the provision of polarizer elements in the mask, and it effectively increases the productivity and decreases the cost, on the other hand.

While the invention has been described with reference to the structures disclosed herein, it is not confined to the details set forth and this application is intended to cover such modifications or changes as may come within the purpose of the improvements or the scope of the following claims.

What is claimed is:

1. An exposure method for exposing a workpiece on the basis of near-field light escaping from openings of an exposure mask, the method comprising:

projecting non-polarized exposure light from a light source onto the exposure mask having a light blocking film formed with a plurality of rectangular openings therein; and performing exposure of a pattern on the basis of the openings with near-field light escaping from the openings, wherein the widths of the openings are smaller than that at a cross-point between a first curve on a coordinate of widths of the openings versus a near-field light intensity for an incident-light electric-field direction perpendicular to a lengthwise direction of a small-opening pattern and a second curve on the same coordinate for an incident-light electric-field direction parallel to the lengthwise direction of the small-opening pattern.

* * * * *